United States Patent
Choi et al.

(10) Patent No.: US 9,076,739 B2
(45) Date of Patent: Jul. 7, 2015

(54) ORGANIC LIGHT-EMITTING DISPLAY APPARATUS AND METHOD FOR MANUFACTURING THE SAME

(71) Applicant: Samsung Display Co., Ltd., Yongin, Gyeonggi-Do (KR)

(72) Inventors: Hae-Yun Choi, Yongin (KR); Gee-Bum Kim, Yongin (KR); Man-Seob Choi, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/013,130

(22) Filed: Aug. 29, 2013

(65) Prior Publication Data

US 2014/0353595 A1    Dec. 4, 2014

(30) Foreign Application Priority Data

Jun. 4, 2013 (KR) .................. 10-2013-0064321

(51) Int. Cl.
H01L 27/32 (2006.01)

(52) U.S. Cl.
CPC ............ *H01L 27/32* (2013.01); *H01L 27/3246* (2013.01)

(58) Field of Classification Search
CPC ............ H01L 51/5262; H01L 51/5271; H01L 51/5275

USPC .......................................................... 257/40
See application file for complete search history.

(56) References Cited

U.S. PATENT DOCUMENTS

| | | | |
|---|---|---|---|
| 2004/0004214 A1* | 1/2004 | Yamazaki et al. | 257/40 |
| 2004/0160165 A1* | 8/2004 | Yamauchi | 313/498 |
| 2005/0046342 A1 | 3/2005 | Park et al. | |
| 2009/0174320 A1 | 7/2009 | Kim | |
| 2009/0194780 A1 | 8/2009 | Kwon | |
| 2013/0049028 A1 | 2/2013 | Kim et al. | |
| 2014/0103308 A1* | 4/2014 | Choi et al. | 257/40 |

FOREIGN PATENT DOCUMENTS

| | | |
|---|---|---|
| KR | 1020050052291 A | 6/2005 |
| KR | 1020090076263 A | 7/2009 |
| KR | 1020090084202 A | 8/2009 |
| KR | 1020120009316 A | 2/2012 |
| KR | 1020130023782 A | 3/2013 |

\* cited by examiner

*Primary Examiner* — Roy Potter
*Assistant Examiner* — Paul Patton
(74) *Attorney, Agent, or Firm* — Cantor Colburn LLP

(57) ABSTRACT

An organic light-emitting display apparatus includes an insulating layer including a inclined structure; a first electrode on the insulating layer; a pixel defining layer on the insulating layer and the first electrode, and defining an emissive region and a non-emissive region; a bump on the pixel defining layer; an organic emission layer on the first electrode; and a second electrode on the organic emission layer.

18 Claims, 8 Drawing Sheets

ORGANIC LIGHT-EMITTING DISPLAY APPARATUS AND METHOD FOR MANUFACTURING THE SAME

This application claims priority to Korean Patent Application No. 10-2013-0064321, filed on Jun. 4, 2013, and all the benefits accruing therefrom under 35 U.S.C. §119, the disclosure of which is incorporated herein in its entirety by reference.

BACKGROUND

1. Field

The invention relates to an organic light-emitting display apparatus and a method for manufacturing the same, and more particularly, to an organic light-emitting display apparatus capable of improving the efficiency of light and a method for manufacturing the same.

2. Description of the Related Art

Generally, an organic light-emitting display apparatus is a self-emissive display apparatus that includes an organic light-emitting device ("OLED"), and the OLED includes a hole injecting electrode, an electron injecting electrode, and an organic emission layer between the hole injecting electrode and electron injecting electrode. In the organic light-emitting display apparatus, holes injected from the hole injecting electrode and electrons injected from the electron injecting electrode are combined in the organic emission layer to generate excitons, and the excitons fall from an excited state to a ground state and generate light.

The organic light-emitting display apparatus, which is a self-emissive display apparatus, does not require a separate light source. Therefore, the organic light-emitting display apparatus is capable of operating at a low voltage, is lightweight and thin, and includes high-quality features such as a wide viewing angle, high contrast and a fast response. Thus, the organic light-emitting display apparatus receives consideration as a next-generation display apparatus.

SUMMARY

One or more exemplary embodiment provides an organic light-emitting display apparatus capable of improving the efficiency of light and a method for manufacturing the same.

According to an exemplary embodiment of the invention, there is provided an organic light-emitting display apparatus including an insulating layer including an inclined structure; a first electrode on the insulating layer; a pixel defining layer on the insulating layer and the first electrode, and defining an emissive region and a non-emissive region; a bump on the pixel defining layer; an organic emission layer on the first electrode; and a second electrode on the organic emission layer.

The first electrode may overlap a bottom surface and a sidewall of the inclined structure.

The pixel defining layer may overlap a bottom surface and a sidewall of the inclined structure of the insulating layer, and an opening may be defined in the pixel defining layer and which exposes the first electrode in the emissive region.

The bump may be adjacent to the emissive region.

A width of the bump may range from about 3 micrometers (μm) to about 20 μm.

A height of the bump may range from about 0.3 micrometer (μm) to about 5 μm.

A sidewall of the inclined structure may form an angle of about 20° to about 70° with respect to a line extended from a bottom surface of the inclined structure.

The inclined structure may be a recess defined in the insulating layer, and the first electrode may have a concave shape corresponding to the recess.

An opening may be defined in the pixel defining layer and which exposes the first electrode in the emissive region, and the organic emission layer may overlap a sidewall of the pixel defining layer at the opening.

The organic emission layer may overlap the pixel defining layer and the bump.

The bump may include a first bump layer having a first width; and a second bump layer on the first bump layer and having a second width, and the first width may be greater than the second width.

The first electrode may overlap a sidewall of the inclined structure of the insulating layer, and reflect light which is emitted by the organic emission layer.

The bump may redirect light emitted by the organic emission layer.

According to another exemplary embodiment of the invention, there is provided an organic light-emitting display apparatus including a substrate; an insulating layer on the substrate, a recess defined in the insulating layer and having a sloped sidewall; an organic light-emitting diode on the insulating layer, and including a first electrode, an organic emission layer and a second electrode; a pixel defining layer between the first and second electrodes, and defining an emissive region and a non-emissive region; and a bump on the pixel defining layer.

The first electrode may overlap the sloped sidewall of the recess defined in the insulating layer.

The organic light-emitting display apparatus may include a plurality of recesses and a plurality of organic light-emitting diodes, and the organic light-emitting diodes may be respectively in the plurality of recesses.

The bump may include a plurality of bump layers, and the plurality of bump layers may be vertically stacked.

The bump may include a curved surface.

The organic light-emitting apparatus may further include a thin film transistor connected to the first electrode.

The organic light-emitting apparatus may further include a sealing film which covers the organic light-emitting diode.

According to another exemplary embodiment of the invention, there is provided a method of manufacturing an organic light-emitting apparatus, the method including providing an insulating layer on a substrate; providing an inclined structure in the insulating layer; providing a first electrode on the insulating layer; providing a pixel defining layer on the insulating layer and the first electrode; providing an opening in the pixel defining layer which exposes the first electrode; providing a bump on the pixel defining layer; providing an organic emission layer on the first electrode; and providing a second electrode on the organic emission layer.

The organic emission layer may overlap the bump.

The bump may include a plurality of bump layers.

The providing a bump may include using a half-tone mask.

The bump may include an organic material.

The providing a bump may include a reflow process.

the inclined structure includes a sloped sidewall which forms an angle with a bottom surface of the inclined structure, and the angle of the inclined structure may be adjusted according to manufacturing conditions.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
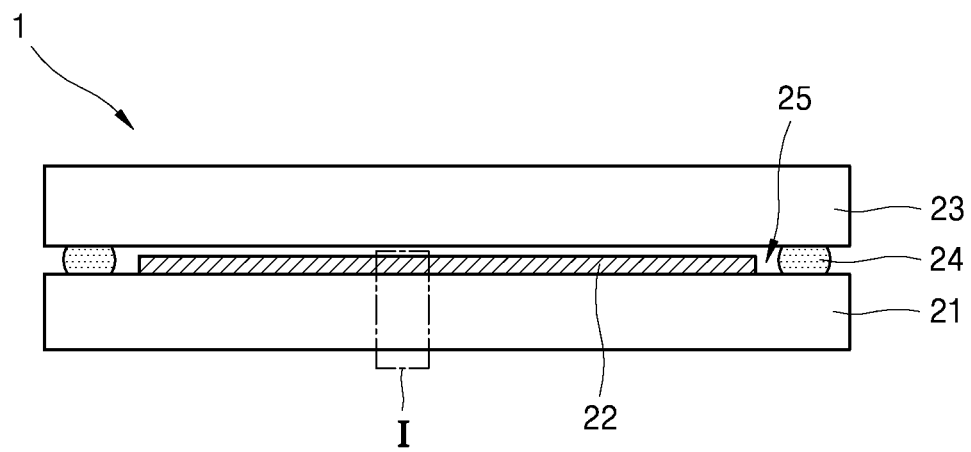
FIG. 1 is a cross-sectional view illustrating an exemplary embodiment of an organic light-emitting display apparatus according to the invention.

Exemplary embodiments will now be described more fully with reference to the accompanying drawings, in which exemplary embodiments of the invention are shown. In the drawings, like reference numerals denote like elements, and the thicknesses of layers and regions are exaggerated for clarity.

The embodiments of the invention described hereinafter are only provided as examples, and various changes in form and details may be made therein. When a layer is described using terms such as "above," "on the top of," or "on" another layer, the layer may be directly on the another layer, or a separate layer may be disposed therebetween.

The terminology used herein is for describing particular embodiments only and is not intended to limit the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Figure 2:
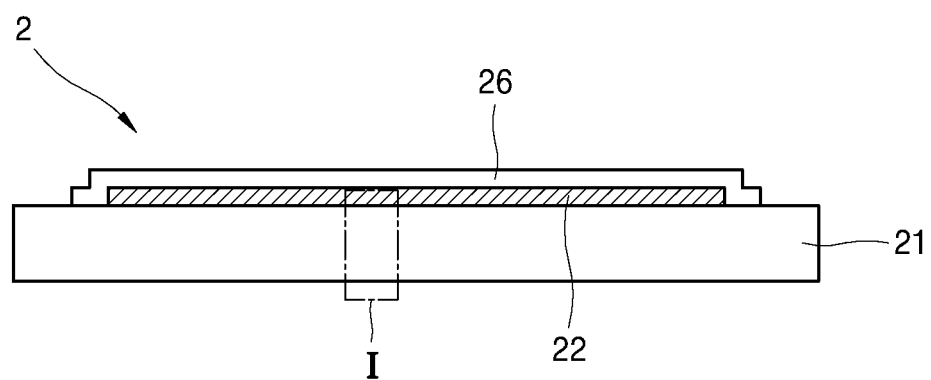
FIG. 2 is a cross-sectional view illustrating another exemplary embodiment of an organic light-emitting display apparatus according to the invention.

Hereinafter, the invention will be described in detail with reference to the accompanying drawings FIGS. 1 and 2 are cross-sectional views of exemplary embodiments of organic light-emitting display apparatuses 1 and 2, respectively, according to the invention.

Referring to FIG. 1, the organic light-emitting display apparatus 1 includes an organic light-emitting unit 22 disposed on a substrate 21, and a sealing substrate 23 facing the substrate 21. The organic light-emitting unit 22 is sealed between the facing substrates 21 and 23.

The sealing substrate 23 includes transparent material to allow display of an image using light from the light-emitting unit 22, and reduces or effectively prevents inflow of oxygen and/or moisture to the organic light-emitting unit 22.

Edges of the substrate 21 and the sealing substrate 23 are connected to each other by a sealing material 24, and an inner space 25 is defined between the substrate 21, the sealing substrate 23 and the sealing material 24. An absorbent or a filling material may be provided in the inner space 25.

Referring to FIG. 2, the organic light-emitting display apparatus 2 includes the organic light-emitting unit 22 disposed on the substrate 21, and a sealing film 26 facing the substrate 21. The organic light-emitting unit 22 is sealed between the facing substrates 21 and 23.

Unlike the organic light-emitting display apparatus 1 of FIG. 1, the organic light-emitting display apparatus 2 of FIG. 2 includes the sealing film 26 instead of the sealing substrate 23. The sealing film 26 may cover the organic light-emitting unit 22 to protect the organic light-emitting unit 22 from exposure to oxygen and/or moisture. In one exemplary embodiment, for example, the sealing film 26 may include a multi-layer structure including an inorganic layer including an inorganic material such as silicon oxide or silicon nitride, alternated with an organic layer including an organic material such as polyimide.

The inorganic layer and/or the organic layer may be plural within the multi-layer structure of the sealing film 26.

The organic layer may include a polymer, and for example, may be a single layer or a stacked layer including one of polyethylene terephthalate, polyimide, polycarbonate, epoxy, polyethylene and polyacrylate, and a combination thereof. In detail, the organic layer may include polyacrylate, and in more detail, may include a polymerized monomer composition including a diacrylate-based monomer and a triacrylate-based monomer. A monoacrylate-based monomer may be further included in the polymerized monomer composition. Also, the polymerized monomer composition may further include a well-known photoinitiator, such as monoacrylphosphine oxide ("TPO"), but is not limited thereto.

The inorganic layer may include a single layer or a stacked layer including a metal oxide or a metal nitride. In detail, the inorganic layer may include one of $SiN_x$, $Al_2O_3$, $SiO_2$ and $TiO_2$, and a combination thereof.

An uppermost layer of the sealing film 26, which is externally exposed, may include the inorganic layer in order to reduce or effectively prevent inflow of water vapor transmission, oxygen or moisture to the organic light-emitting unit 22 and/or an organic light-emitting diode therein.

In exemplary embodiments, the sealing film 26 may include a multi-layer structure, in which at least one organic layer is inserted between at least two inorganic layers. In other exemplary embodiments, the sealing film 26 may include a multi-layer structure, in which at least one inorganic layer is inserted between at least two organic layers.

The sealing film 26 may include a first inorganic layer, a first organic layer and a second inorganic layer sequentially stacked from a top of the organic light-emitting unit 22. The sealing film 26 may include a first inorganic layer, a first organic layer, a second inorganic layer, a second organic layer and a third inorganic layer sequentially stacked from the top of the organic light-emitting unit 22. Alternatively, the sealing film 26 may include a first inorganic layer, a first organic layer, a second inorganic layer, a second organic layer, a third inorganic layer, a third organic layer and a fourth inorganic layer sequentially stacked from the top of the organic light-emitting unit 22.

A halogenated metal layer including LiF may be further disposed between the organic light-emitting unit 22 and the first inorganic layer of the sealing film 26. In an exemplary embodiment of manufacturing an organic light-emitting display apparatus, the halogenated metal layer may reduce or effectively prevent the organic light-emitting unit 22 from being damaged while forming (e.g., providing) the first inorganic layer via a sputtering method or a plasma deposition method.

A size of the first organic layer may be smaller than that of the second inorganic layer, and the size of the second organic layer may be smaller than that of the third inorganic layer. The size of a layer may refer to a cross-sectional thickness and/or a planar dimension (e.g., planar length and width) of the layer, but not being limited thereto. Also, the first organic layer may be completely covered by the second inorganic layer, and the second organic layer may be completely covered by the third inorganic layer. That is, no portion of the covered layer may be exposed to outside the sealing film 26.

Alternatively, the sealing film 26 may have a structure including low melting glass such as tin oxide (SnO), but is not limited thereto.

Figure 3:
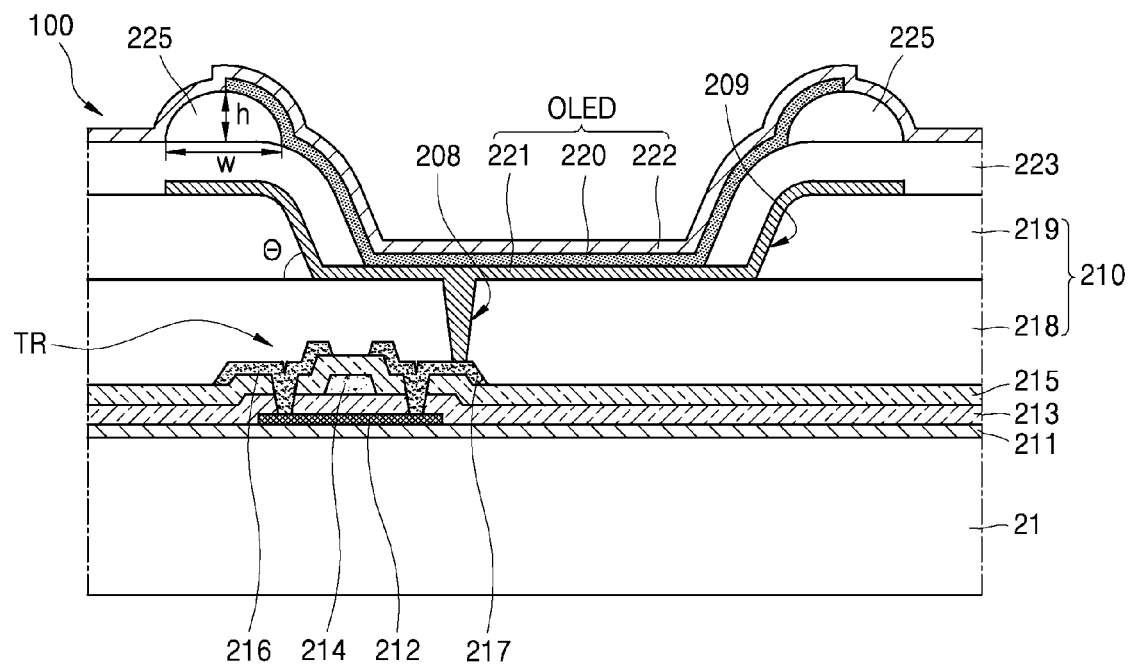
FIG. 3 is an enlarged cross-sectional view of an exemplary embodiment of section "I" illustrated in FIGS. 1 and 2, according to the invention.

FIG. 3 is an enlarged cross-sectional view of section "I" illustrated in FIGS. 1 and 2, according to the invention.

Referring to FIG. 3, an organic light-emitting display apparatus 100 may include the substrate 21, a buffer layer 211, a thin film transistor TR, an insulating layer 210 including an inclined structure 209, an organic light-emitting diode ("OLED"), a pixel defining layer 223, and a bump 225.

The substrate 21 may include transparent glass having $SiO_2$ as a main component. However, the substrate 21 is not limited thereto, and may include various materials such as ceramic, transparent plastic metal, and the like.

The buffer layer 211 may be disposed on the substrate 21 to reduce or effectively prevent spread of impurity ions, and inflow of moisture or air, and planarize an upper surface of the substrate 21. In exemplary embodiments, the buffer layer 211 may include an inorganic material such as silicon oxide, silicon nitride, silicon oxynitride, aluminum oxide, aluminum nitride, titanium oxide, or titanium nitride; an organic material such as polyimide, polyester, or acryl; or a stacked layer thereof. In an alternative exemplary embodiment, the buffer layer 211 may be omitted. In an exemplary embodiment of manufacturing an organic light-emitting display apparatus, the buffer layer 211 may be formed (e.g., provided) by using various deposition methods such as plasma enhanced chemical vapor deposition ("PECVD"), atmospheric pressure chemical vapor deposition ("APCVD"), low pressure CVD ("LPCVD"), and the like.

The thin film transistor TR includes an active layer 212, a gate electrode 214, a source electrode 216 and a drain electrode 217. A gate insulating layer 213 is disposed between the gate electrode 214 and the active layer 212 to insulate the gate electrode 214 from the active layer 212.

The active layer 212 may be disposed on the buffer layer 211, and include an inorganic semiconductor such as amorphous silicon or poly silicon, or an organic semiconductor. In exemplary embodiments, the active layer 212 may include an oxide semiconductor. In one exemplary embodiment, for example, the oxide semiconductor may include an oxide of a material selected from Group 12 to 14 metal elements such as zinc (Zn), indium (In), gallium (Ga), tin (Sn), cadmium (Cd), germanium (Ge) and hafnium (Hf), and combinations thereof.

The gate insulating layer 213 is disposed on the buffer layer 211 to cover the active layer 212, and the gate electrode 214 is disposed on the gate insulating layer 213.

An interlayer insulating layer 215 is disposed on the gate insulating layer 213 to cover the gate electrode 214. The source and drain electrodes 216 and 217 are disposed on the interlayer insulating layer 215. One or more contact hole may be defined extending through a thickness of the gate insulating layer 213 and/or the interlayer insulating layer 215. The source and drain electrodes 216 and 217 respectively contact the active layer 212 through a contact hole.

The thin film transistor TR is not limited to the structure described above, and may include various structures. In one exemplary embodiment, for example, the thin film transistor TR may be a top gate type as illustrated in FIG. 3, or a bottom gate type in which the gate electrode 222 is disposed under the active layer 212.

The organic light-emitting display apparatus may further include a pixel circuit (not shown) which includes the thin film transistor TR and a capacitor.

The insulating layer 210 includes an inclined structure 209, and may be disposed on the interlayer insulating layer 215 to cover the pixel circuit which includes the thin film transistor TR. The insulating layer 210 may include a plurality of insulating films.

The inclined structure 209 includes a flat bottom surface, and a sidewall which is slanted or inclined by angle θ. In an exemplary embodiment of manufacturing an organic light-emitting display apparatus, the inclined structure 209 may be provided by forming a recess having slanted sidewalls in a portion of the insulating layer 210. The angle θ is formed by a line extended from and parallel to the bottom surface of the inclined structure 209 and a sidewall of the inclined structure 209, and may be adjusted. Since the inclined structure 209 includes the sidewall which is slanted by the angle θ, a width of an upper portion of the inclined structure 209 taken parallel to the bottom surface may be greater than that of a lower portion of the inclined structure 209. In exemplary embodiments, the angle θ may range from about 20° to about 70° with respect to the line extended from the bottom surface.

The insulating layer 210 may include an inorganic material and/or organic material. In one exemplary embodiment, for example, the insulating layer 210 may include one of a photoresist, an acryl-based polymer, a polyimide-based polymer, a polyamide-based polymer, a siloxane-based polymer, a polymer including a photosensitive acrylic carboxyl group, a novolac resin, an alkali soluble resin, silicon oxide, silicon nitride, silicon oxynitiride, silicon oxycarbide, silicon carbonitride, aluminum (Al), magnesium (Mg), Zn, Hf, zirconium (Zr), titanium (Ti), tantalum (Ta), aluminum oxide, titanium oxide, tantalum oxide, magnesium oxide, zinc oxide (ZnO), hafnium oxide and zirconium oxide, and a combination thereof.

In exemplary embodiments, the insulating layer 210 may include a first insulating sub-layer 218 and a second insulating sub-layer 219. The first insulating sub-layer 218 may be a monolayer or a multi-layer structure including a plurality of insulating layers. The first insulating sub-layer 218 may have a flat upper surface. The second insulating sub-layer 219 is disposed on the first insulating sub-layer 218, and may include the inclined structure 209. The first and second insulating sub-layers 218 and 219 may include the same, similar or different materials.

The OLED is disposed on the insulating layer 210, and includes a first electrode 221, an organic emission layer 220 and a second electrode 222. The pixel defining layer 223 is disposed on the insulating layer 210 and the first electrode 221, and defines an emissive region and a non-emissive region of the organic light-emitting display apparatus.

The organic emission layer 220 may include a low-molecular or high-molecular organic material. If the organic emission layer 220 includes a low-molecular organic material, a monolayer, or a multi-layer structure of a hole injection layer ("HIL"), a hole transport layer ("HTL"), an emission layer ("EML"), an electron transport layer ("ETL") and an electron injection layer ("EIL") may be used. In an exemplary embodiment of manufacturing an organic light-emitting display apparatus, the low-molecular organic material may be formed (e.g., provided) by using a vacuum deposition method. Where the low-molecular organic material is formed by using the vacuum deposition method, the EML may be independently formed in each of red, green and blue pixels, and the HIL, the HTL, the ETL and the EIL may be formed as a common layer commonly applied to the red, green and blue pixels.

If the organic emission layer 220 is includes of a high-molecular organic material, only the HTL may be formed in a direction toward the first electrode 221 from the EML. In an exemplary embodiment of manufacturing an organic light-emitting display apparatus, the HTL may be formed on the first electrode 221 by using poly-(2,4)-ethylene-dihydroxy thiophene ("PEDOT") or polyaniline ("PANI"), and inkjet printing or spin coating. Where the HTL is formed on the first electrode 221 by using PEDOT or PANI, and inkjet printing or spin coating, a poly-phenylenevinylene ("PPV")-based high-molecular organic material or a polyfluorene-based high-molecular organic material may be used, and a color pattern may be formed by using a typical method such as inkjet printing, spin coating or thermal transfer printing using a laser.

The HIL may include, for example, a phthalocyanine compound such as copper phthalocyanine, or a starburst-type amine such as 4,4',4"-tri(N-carbazolyl)triphenylamine ("TCTA"), 4,4',4"-tris(3-methylphenyl-N-phenylamino) triphenylamine ("m-MTDATA"), or 1,3,5-tris[4-(3-methylphenyl)phenylamino]phenyl]benzene ("m-MTDAPB").

The HTL may include, for example, N,N'-bis(3-methylphenyl)-N,N'-diphenyl-[1,1-biphenyl]-4,4'diamine ("TPD") or N,N'-di(naphthalene-1-yl)-N,N'-diphenyl benzidine ("α-NPD").

The EIL may include, for example, LiF, NaCl, CsF, $Li_2O$, BaO or 8-hydroxyquinolinolato-lithium ("Liq").

The ETL may include, for example, tris(8-hydroxy-quinolinato)aluminum ("$Alq_3$").

The EML may include a host material and a dopant material.

The host material may include tris(8-hydroxy-quinolinato)aluminum ("$Alq_3$"), 9,10-di(naphth-2-yl)anthracene ("ADN"), 3-tert-butyl-9,10-di(naphth-2-yl)anthracene ("TBADN"), 4,4'-bis(2,2-diphenylvinyl)-1,1'-biphenyl ("DPVBi"), 4,4'-Bis[2,2-di(4-methylphenyl)-ethen-1-yl]biphenyl ("p-DMDPVBi"), tert(9,9-diarylfluorene) ("TDAF", CAS 474918-42-8), 2-(9,9'-spirobifluorene-2-yl)-9,9'-spirobifluorene ("BSDF"), 2,7-bis(9,9'-spirobifluorene-2-yl)-9,9'-spirobifluorene ("TSDF"), bis(9,9-diarylfluorene) ("BDAF", CAS 854046-47-2), 4,4'-bis(2,2-diphenyl-ethen-1-yl)-4,4'-di-(tert-butyl)phenyl ("p-TDPVBi"), 1,3-bis(carbazol-9-yl) benzene ("mCP"), 1,3,5-tris(carbazol-9-yl)benzene ("tCP"), 4,4',4"-tris(carbazol-9-yl)triphenylamine ("TcTa"), 4,4'-bis (carbazol-9-yl)biphenyl ("CBP"), 4,4'-bis(9-carbazolyl)-2, 2'-di methyl-biphenyl ("CBDP"), 4,4'-bis(carbazol-9-yl)-9, 9-dimethyl-fluorene ("DMFL-CBP"), 4,4'-bis(carbazol-9-yl)-9,9-bis(9-phenyl-9H-carbazol)fluorene ("FL-4CBP"), 4,4'-bis(carbazol-9-yl)-9,9-di-tolyl-fluorene ("DPFL-CBP"), or 9,9-bis(9-phenyl-9H-carbazol)fluorene ("FL-2CBP").

The dopant material may include 4,4'-bis[4-(di-p-tolylamino)styryl]biphenyl ("DPAVBi"), 9,10-di(naph-2-tyl)anthracene ("ADN"), 2-tert-butyl-9,10-di(naph-2-tyl)anthracene or 3-tert-butyl-9,10-di(naph-2-tyl)anthracene ("TBADN").

The first electrode 221 is disposed on the insulating layer 210. The first electrode 221 may be disposed on the bottom surface of the inclined structure 209 and extended to and along the sidewall of the inclined structure 209. An angle formed by a line extended from the bottom surface, and the first electrode 221 may be the same as or similar to the angle θ. Since the first electrode 221 is disposed on the sidewall of the inclined structure 209, the first electrode 221 may have a concave shape.

When light generated by the organic emission layer 220 is incident upon the portion of the first electrode 221 which is disposed on the sidewall of the inclined structure 209, the incident light may be reflected by the portion of the first electrode 221 and emitted to the outside. Where the incident light is reflected by a portion of the first electrode 221, the angle θ formed by the line extended from and parallel to the bottom surface of the inclined structure 209 and a sidewall of the inclined structure 209, may be adjusted to direct the light generated by the organic emission layer 220 and reflected by the first electrode 221 toward a desirable direction. Therefore, the efficiency of light, emitted to the outside by portion of the OLED disposed in the inclined structure 209, may be improved.

The first electrode 221 may be physically and/or electrically connected to the drain electrode 217 of the thin film transistor TR through a through hole 208 defined to penetrate through the insulating layer 210. Although the through hole 208 illustrated in FIG. 3 is defined extended through the bottom surface of the inclined structure 209, the through hole 208 is not limited thereto. The through hole 208 may be defined to extend through the sidewall of the inclined structure 209 or the upper surface of the insulating layer 210.

The first electrode 221 may function as an anode and the second electrode 222 may function as a cathode. However, the polarities of the first and second electrodes 221 and 222 are not limited thereto and may be switched.

If the first electrode 221 functions as an anode, the first electrode 221 may include indium tin oxide ("ITO"), indium zinc oxide ("IZO"), ZnO or indium oxide (In$_2$O$_3$) having a high work function. If the organic light-emitting display apparatus 100 is a top emission type display for displaying an image in a direction opposite to the substrate 21, the first electrode 221 may further include a reflective layer including metal such as silver (Ag), Mg, Al, platinum (Pt), palladium (Pd), gold (Au), nickel (Ni), neodymium (Nd), iridium (Ir), chromium (Cr), lithium (Li), ytterbium (Yb), or calcium (Ca) or an alloy thereof. Also, the first electrode 221 may have a monolayer or a multi-layer structure including the above-mentioned metal or alloy. In exemplary embodiments, the first electrode 221 may include an ITO/Ag/ITO multi-layer structure as a reflective electrode.

If the second electrode 222 functions as a cathode, the second electrode 222 may include metal such as Ag, Mg, Al, Pt, Pd, Au, Ni, Nd, Ir, Cr, Li or Ca. If the organic light-emitting display apparatus 100 is a top emission type display, the second electrode 222 transmits light. In exemplary embodiments, the second electrode 222 may include transparent conductive metal oxide such as ITO, IZO, zinc tin oxide ("ZTO"), ZnO or In$_2$O$_3$.

According to another exemplary embodiment, the second electrode 222 may have a thin film structure including at least one selected from Li, Ca, LiF/Ca, LiF/Al, Al, Ag, Mg and Yb, and a combination thereof. In one exemplary embodiment, for example, the second electrode 222 may include a monolayer or a multi-layer structure including Mg:Ag, Ag:Yb, and/or Ag. Unlike the first electrode 221, the second electrode 222 may be configured to apply a common voltage to all pixels.

The pixel defining layer 223 is disposed on the insulating layer 210 and the first electrode 221, and may define an emissive region and a non-emissive region. The pixel defining layer 223 covers the portion of the first electrode 221 which is disposed on the sidewall of the inclined structure 209, and may be extended to the upper surface of the insulating layer 210. In other words, the pixel defining layer 223 may be disposed on a portion of the bottom surface of the inclined structure 209 and the upper portion of the sidewall. A portion in which the pixel defining layer 223 is disposed may be defined as the non-emissive region, and an opening 223a (refer to FIG. 4D) which is defined in the pixel defining layer 223 and exposes the first electrode 221 may be defined as the emissive region. A height from a bottom surface of the opening 223a to the upper surface of the pixel defining layer 223 may be a few micrometers (μm). In one exemplary embodiment, for example, the height may range from about 2 μm to about 5 μm.

The organic emission layer 220 may be disposed on the pixel defining layer 223. In other words, the organic emission layer 220 may be disposed on the first electrode 221 in the opening 223a, and extended to the upper portion of the pixel defining layer 223.

The pixel defining layer 223 may include an organic material and/or inorganic material. In one exemplary embodiment, for example, the pixel defining layer 223 may include an organic material such as a photoresist, a polyacryl-based resin, a polyimide-based resin or an acryl-based resin; and/or an inorganic material such as a silicon compound.

The bump 225 is disposed on the pixel defining layer 223. The bump 225 is to redirect light generated from the organic emission layer 220. Some of the light that is generated from the organic emission layer 220 in the emissive region may not be emitted to the outside, but transferred along the organic emission layer 220 which is disposed on the pixel defining layer 223. The bump 225 is to emit these kinds of light to the outside. The surface of the bump 225 may be curved, such as being a convex protrusion relative to the pixel defining layer 223. At an edge of the curved surface of the bump 225, the light may be redirected and emitted to the outside. The bump 225 may be disposed on the pixel defining layer 223, adjacent to the emissive region.

The organic emission layer 220 may be disposed on the bump 225. In other words, the organic emission layer 220 may be disposed on the first electrode 221 in the opening 223a, and extended to the upper portion of the pixel defining layer 223 and the bump 225. Also, the organic emission layer 220 may cover the bump 225, that is, extend along an entire upper surface of the bump 225.

The second electrode 222 may be disposed on the bump 225. Where the second electrode 222 is disposed on the bump 225, a shape and/or size of the bump 225 may be defined with respect to deposition conditions and/or electrical properties of the second electrode 222. Although in FIG. 3, a cross-section of the bump 225 is illustrated in a shape of a half circle, the bump 225 is not limited thereto. That is, the bump 225 may be in any shape with a curved surface. In one exemplary embodiment, for example, a cross-section of the bump 225 may be in any of a number shapes such as a polygon or an oval. The bump 225 may be disposed on the pixel defining layer 233 and cover the opening 223a defined in the pixel defining layer 223, or a plurality of bumps 225 may be disposed on the pixel defining layer 233, spaced apart by a predetermined distance.

In exemplary embodiments, a width w of the bump 225 taken parallel to the line extended from the bottom surface of the inclined structure 209 may range from a few μm to tens of μm. In one exemplary embodiment, for example, the width w of the bump 225 may range from about 3 μm to about 20 μm. In exemplary embodiments, the height h of the bump 225 taken perpendicular to the upper surface of the pixel defining layer 223 may range from a few μm to hundreds of μm. In one exemplary embodiment, for example, the height h of the bump 225 may range from about 0.3 μm to about 5 μm. However, the width and height of the bump 225 are not limited thereto.

The bump 225 may include an organic material and/or inorganic material. In one exemplary embodiment, for example, the bump 225 may include an organic material such as a photoresist, a polyacryl-based resin, a polyimide-based resin, or an acryl-based resin; and/or an inorganic material such as a silicon compound.

FIGS. 4A through 4G are sequential cross-sectional views for describing an exemplary embodiment of a method for manufacturing the organic light-emitting display apparatus 100 of FIG. 3, according to the invention.

Figure 4A:
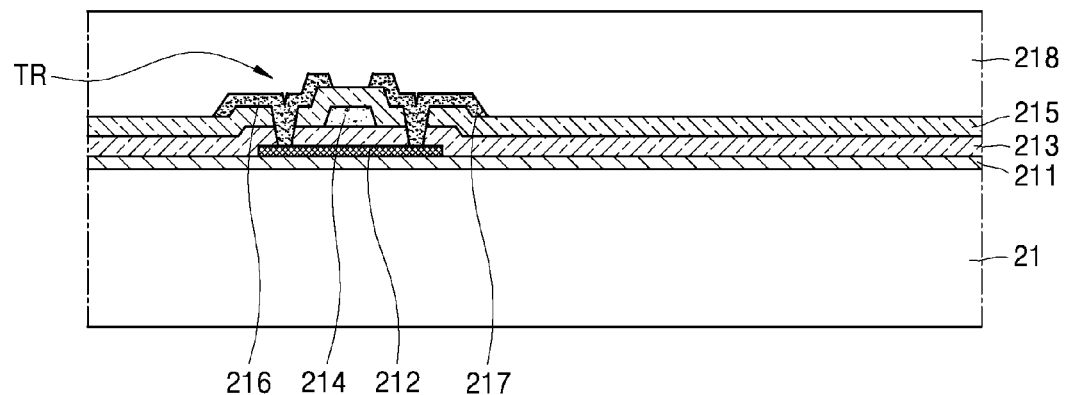
FIGS. 4A through 4G are sequential cross-sectional views for describing an exemplary embodiment of a method for manufacturing the organic light-emitting display apparatus of FIG. 3, according to the invention.

Referring to FIG. 4A, the buffer layer 211 is formed (e.g., provided) on the substrate 21, and may be formed by using various deposition methods such as PECVD, APCVD, LPCVD and the like. Before forming the buffer layer 211 on the substrate 21, the substrate 21 may be planarized by using chemical mechanical planarization and/or an etch back process, to provide a surface of the substrate 21 which is substantially flat.

The active layer 212 is formed on the buffer layer 211, and may include an inorganic semiconductor such as amorphous silicon, or an organic semiconductor. In exemplary embodiments, the active layer 212 may include an oxide semiconductor. The active layer 212 may be formed by using various deposition methods such as PECVD, APCVD, LPCVD and the like. The active layer 212 may be formed on an entirety of the buffer layer 211, and then patterned by etching. The active layer 212 may be additionally crystallized.

The gate insulating layer 213 covering the active layer 212 is formed on the buffer layer 211. A cross-sectional thickness of the gate insulating layer 213 may be substantially uniform, depending on the profile of the active layer 212.

The gate electrode 214 is formed on the gate insulating layer 213. The gate electrode 214 is formed on a portion of the gate insulating layer 213 in which the active layer 212 is disposed thereunder. The gate electrode 214 may include metal, an alloy, metal nitride, conductive metal oxide, a transparent conductive material or the like.

The interlayer insulating layer 215 is formed on the gate insulating layer 213 to cover the gate electrode 214. A cross-sectional thickness of the interlayer insulating layer 215 may be substantially uniform, depending on the profile of the gate insulating layer 213. The interlayer insulating layer 215 may include a silicon compound.

The source and drain electrodes 216 and 217 are formed on the interlayer insulating layer 215. The source and drain electrodes 216 and 217 are spaced apart from each other by a predetermined distance with respect to the gate electrode 214 in the center, and disposed near the gate electrode 214. A through hole may be defined through the gate insulating layer 213 and the interlayer insulating layer 215, to expose the active layer 212. The source and drain electrodes 216 and 217 penetrate through the interlayer insulating layer 215 and the gate insulating layer 213, and respectively contact opposing ends of the active layer 212. The source and drain electrodes 216 and 217 may include metal, an alloy, metal nitride, conductive metal oxide, a transparent conductive material or the like.

In exemplary embodiments, the interlayer insulating layer 215 and the gate insulating layer 213 may be partially etched to form the through hole that exposes the active layer 212. Then, the through hole is filled with a conductive material, and thus a conductive layer (not shown) is formed on the interlayer insulating layer 215. Then, the conductive layer including the conductive material may be patterned to form the source and drain electrodes 216 and 217.

The first insulating sub-layer 218, which covers the source and drain electrodes 216 and 217, is formed on the interlayer insulating layer 215. The first insulating sub-layer 218 may be thick enough to completely cover the source and drain electrodes 216 and 217. The first insulating sub-layer 218 may include an inorganic material and/or organic material. Depending on the material of the first insulating sub-layer 218, the first insulating sub-layer 218 may be formed by using spin coating, printing, sputtering, CVD, atomic layer deposition ("ALD"), PECVD, high-density plasma chemical vapor deposition ("HDP-CVD"), vacuum deposition, or the like.

Figure 4B:
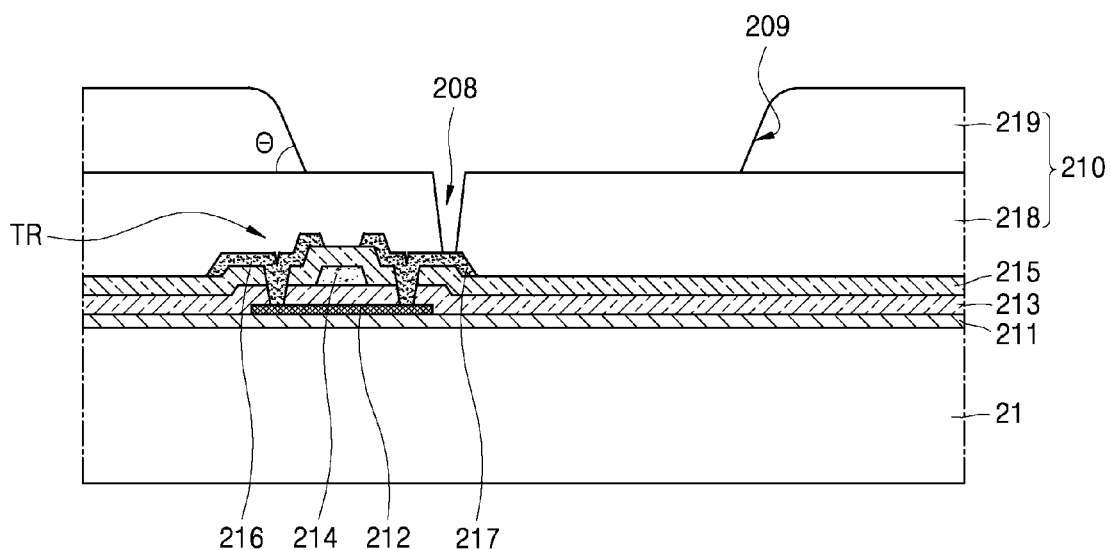

Referring to FIG. 4B, the second insulating sub-layer 219 with a inclined structure 209 is formed on the first insulating sub-layer 218. The second insulating sub-layer 219 may include an inorganic material and/or organic material. Depending on the material of the second insulating sub-layer 219, the second insulating layer 219 may be formed by using spin coating, printing, sputtering, CVD, ALD, PECVD, HDP-CVD, vacuum deposition or the like. The first and second insulating sub-layers 218 and 219 of the collective insulating layer 210 may be formed of the same or similar materials. The second insulating sub-layer 219 may be a monolayer or a multi-layer structure.

To form the inclined structure 209, a recess may be defined in the second insulating sub-layer 219. A stepped portion (not shown) may be formed on a sidewall of the recess. A plurality of etching processes may be performed by using a plurality of masks to form the recess, but is not limited thereto. A half-tone mask may be used to form the stepped portion on the sidewall of the recess.

A reflow process may be executed on the second insulating sub-layer 219, and thus the stepped portion may be formed to have the overall inclined structure 209 with a fixed angle θ. Therefore, the recess may be a recess with a sloped sidewall. The reflow process may be executed in a temperature ranging from about 50% to about 80% of a melting point of the material of the second insulating sub-layer 219. A shape of the stepped portion, and processing time and temperature of the reflow process may be adjusted to form the inclined structure 209 with a desired sidewall angle θ.

Referring to FIG. 4B, the through hole 208, which penetrates through the first insulating sub-layer 218 and exposes the drain electrode 217 of the thin film transistor TR, is formed. Although in FIG. 4B, the through hole 208 is illustrated to only penetrate through the first insulating sub-layer 218, the through hole 208 is not limited thereto. In one exemplary embodiment, for example, according to a position of the thin film transistor TR, the through hole 208 may sequentially penetrate through the upper portion of the second insulating sub-layer 219, an entire thickness of the second insulating sub-layer 219, and an entire thickness of the first insulating sub-layer 218, and thus reach the thin film transistor TR.

Figure 4C:
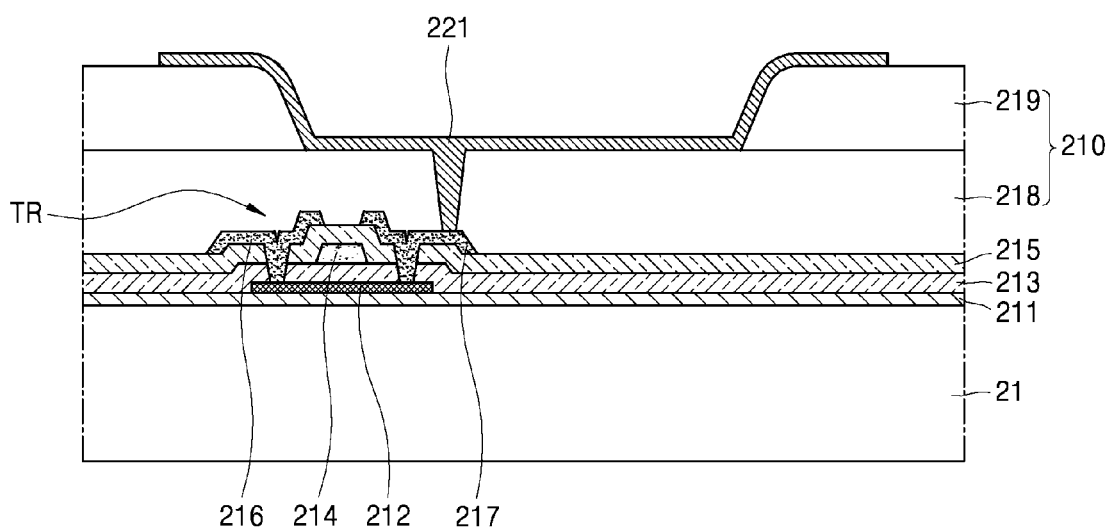

Referring to FIG. 4C, the first electrode 221 is formed to have an inclined structure corresponding to the inclined structure 209 with the second insulating sub-layer 219 forming the angle θ with the bottom surface of the inclined structure 209.

The recess having the sloped sidewalls may be substantially in the center of the first electrode 221. The first electrode 221 fills the through hole 208 and is physically and/or electrically connected to the drain electrode 217 of the thin film transistor TR.

The first electrode 221 may include a reflective material. In one exemplary embodiment, for example, the first electrode 221 may include metal such as Ag, Mg, Al, Pt, Pd, Au, Ni, Nd, Ir, Cr, Li, Yb, or Ca or an alloy thereof. Also, the first electrode 221 may have a mono layer or a multi-layer structure including the metal or alloy mentioned above. In exemplary embodiments, the first electrode 221 may include an ITO/Ag/ITO structure as a reflective electrode.

The first electrode 221 may be formed by using sputtering, vacuum deposition, CVD, pulse laser deposition (PLD), printing, ALD, or the like. The first electrode 221 may be patterned to correspond to each pixel of a plurality of pixels. The first electrode 221 may be extended from the emissive region to a portion of an adjacent non-emissive region. In other words, the first electrode 221 may be formed on the sidewall of the inclined structure 209 of the second insulating sub-layer 219. Also, the first electrode 221 may be formed on the upper surface of the second insulating sub-layer 219, as well as on the bottom part of the inclined structure 209.

Figure 4D:
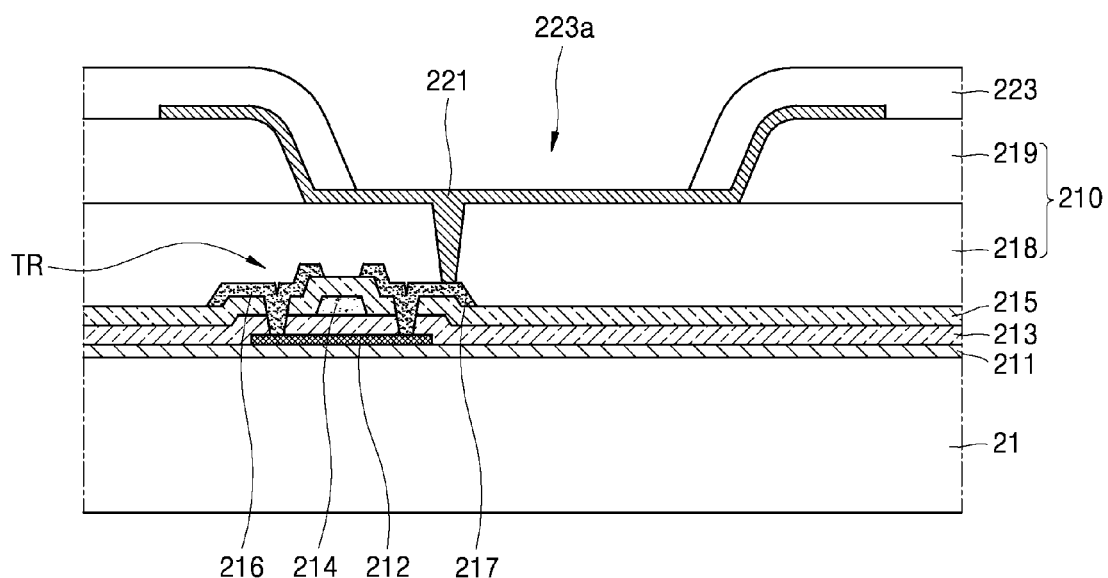

Referring to FIG. 4D, the pixel defining layer 223 covering the edges of the first electrode 221 is formed on the second insulating sub-layer 219.

To form the pixel defining layer 223, a preliminary pixel defining layer (not shown) covering the first electrode 221 is formed on the second insulating sub-layer 219. The preliminary pixel defining layer may include an organic material and/or inorganic material. Depending on the material of the preliminary pixel defining layer, the preliminary pixel defining layer may be formed by using spin coating, printing, sputtering, CVD, ALD, PECVD, HDP-CVD, vacuum deposition, or the like.

Then, the preliminary pixel defining layer is partially etched to form the opening 223a which exposes a portion of the first electrode 221. When the opening 223a is formed, an emissive region and a non-emissive region of the organic light-emitting display apparatus 100 may be defined. That is, the portion in which the pixel defining layer 223 is formed may define the non-emissive region, and the opening 223a may define the emissive region.

Figure 4E:
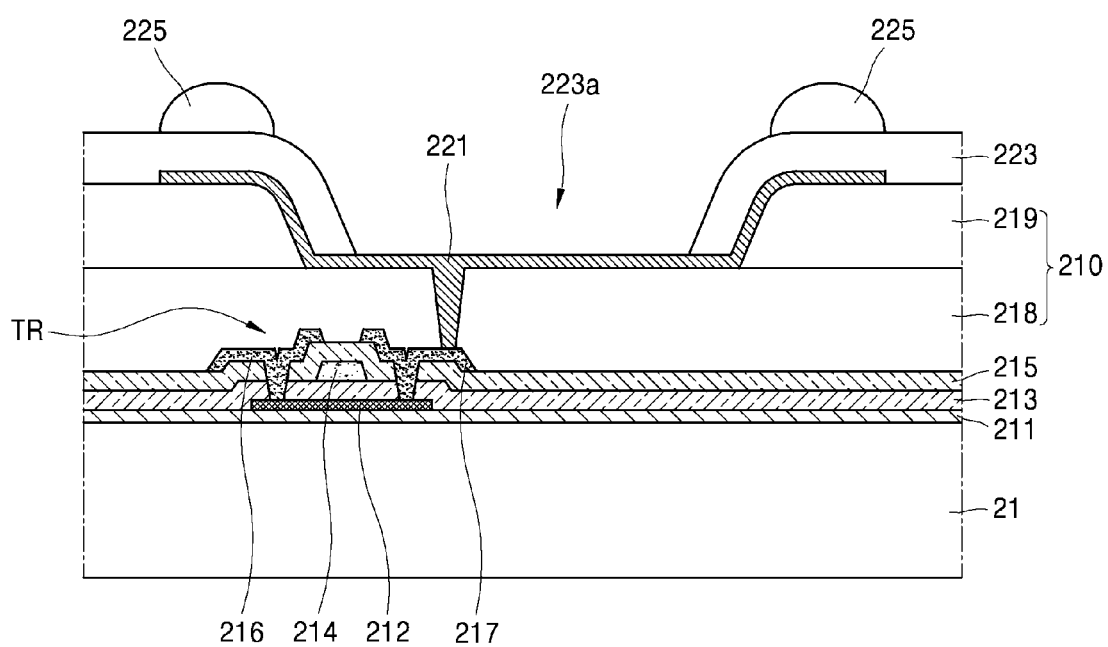

Referring to FIG. 4E, the bump 225 is formed on the pixel defining layer 223. The bump 225 may include an organic material and/or an inorganic material. Depending on the material of the bump 225, the bump 225 may be formed by using spin coating, printing, sputtering, CVD, ALD, PECVD, HDP-CVD, vacuum deposition, or the like.

Additionally, an exposure process for irradiating light such as an ultraviolet ray or a laser may be executed to form the bump 225. Alternatively, an etching process may be executed to form the bump 225. The exposure process or the etching process may be selectively executed, depending on the material of the bump 225. Also, a mask may be used to perform the exposure process and the etching process.

In exemplary embodiments, the mask may be a half-tone mask, a half-tone slit mask, or the like. The shape of the bump 225, such as a degree of a curve of the bump 225, may be adjusted according to the conditions of the exposure process or the etching process. In exemplary embodiments, a reflow process may be executed to adjust the shape of the bump 225. The reflow process may be executed in a temperature ranging from about 50% to about 80% of a melting point of the material of the bump 225.

Figure 4F:
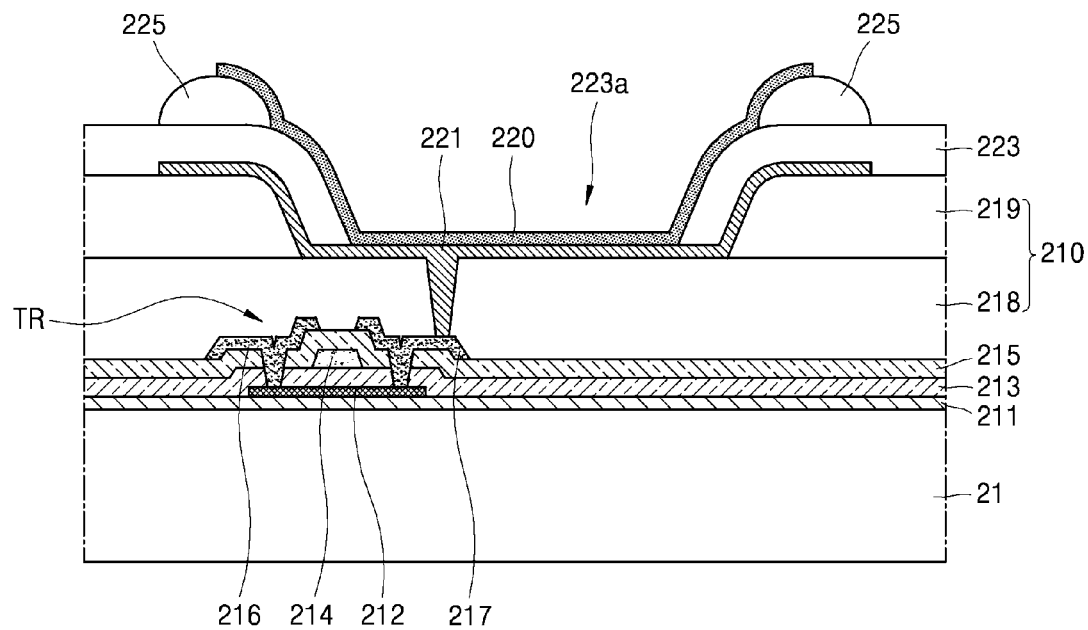

Referring to FIG. 4F, the organic emission layer 220 is formed on the first electrode 221. The opening 223a in the pixel defining layer 223 may be substantially in the center of the organic emission layer 220. The organic emission layer 220 may be formed on the sidewall of the pixel defining layer 223 and the bump 225. The organic emission layer 220 may be a monolayer or a multi-layer structure. In exemplary embodiments, the organic emission layer 220 may be formed by using vacuum deposition. According to another exemplary embodiment, the organic emission layer 220 may be formed by using inkjet printing, spin coating, thermal transfer printing using a laser or the like.

Figure 4G:
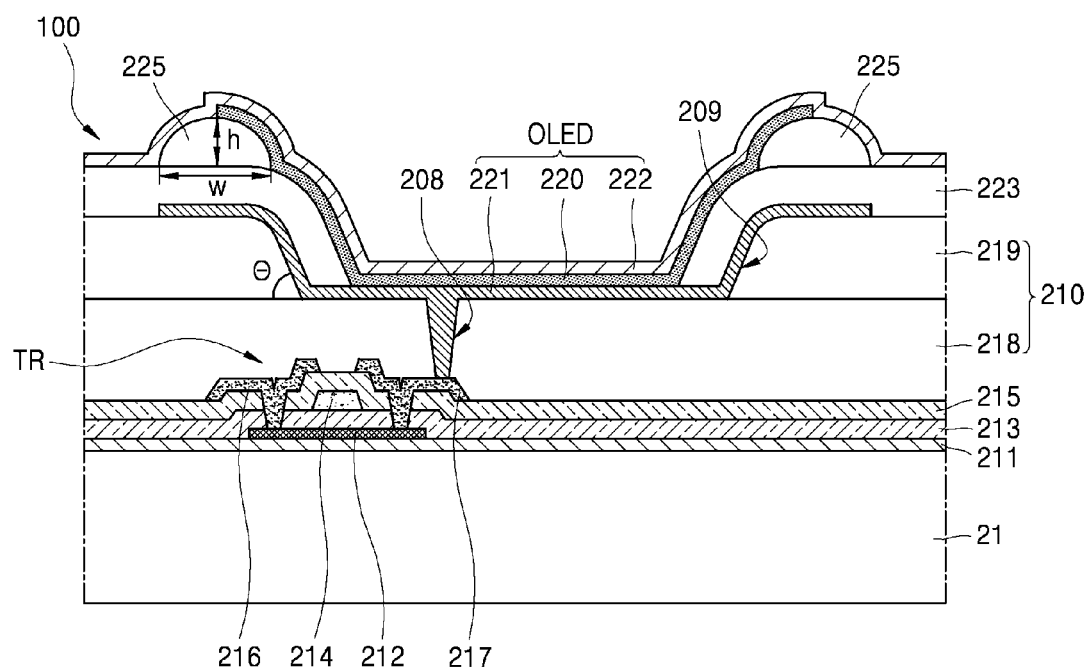

Referring to FIG. 4G, the second electrode 222 is formed on the organic emission layer 220. The second electrode 222 may be formed on the pixel defining layer 223 and the bump 225.

The second electrode 222 may include a transparent conductive material. The second electrode 22 may include conductive metal oxide such as ITO, IZO, ZTO, ZnO or $In_2O_3$. According to another exemplary embodiment, the second electrode 22 may include a thin film including at least one selected from Li, Ca, LiF/Ca, LiF/Al, Al, Ag, Mg and Yb, and a combination thereof. In one exemplary embodiment, for example, the second electrode 222 may include a monolayer or a multi-layer structure including Mg:Ag, Ag:Yb, and/or Ag.

The second electrode 222 may be formed by using sputtering, vacuum deposition, CVD, PLD, printing, ALD or the like. In exemplary embodiments, the second electrode 22 may be disposed so that the same voltage is applied to all pixels.

A protective layer (not shown) may be additionally formed on the second electrode 222. The protective layer may cover and protect the OLED. The protective layer may include an inorganic insulating layer and/or an organic insulating layer, and be formed by using various deposition methods such as PECVD, APCVD, and LPCVD.

As illustrated in FIG. 1 or 2, the organic light-emitting display apparatus 100 may be completed after being covered by the sealing substrate 23 or the sealing film 26.

Although an exemplary embodiment of a method for manufacturing the organic light-emitting display apparatus 100 of FIG. 3 is described in the illustrated embodiment, various changes may be made and maintain the spirit and scope of the invention.

Since the organic light-emitting display apparatus 100 described above includes the insulating layer 210 with the inclined structure 209 and the bump 225, light generated from the organic emission layer 220 may be efficiently emitted to the outside.

Figure 5:
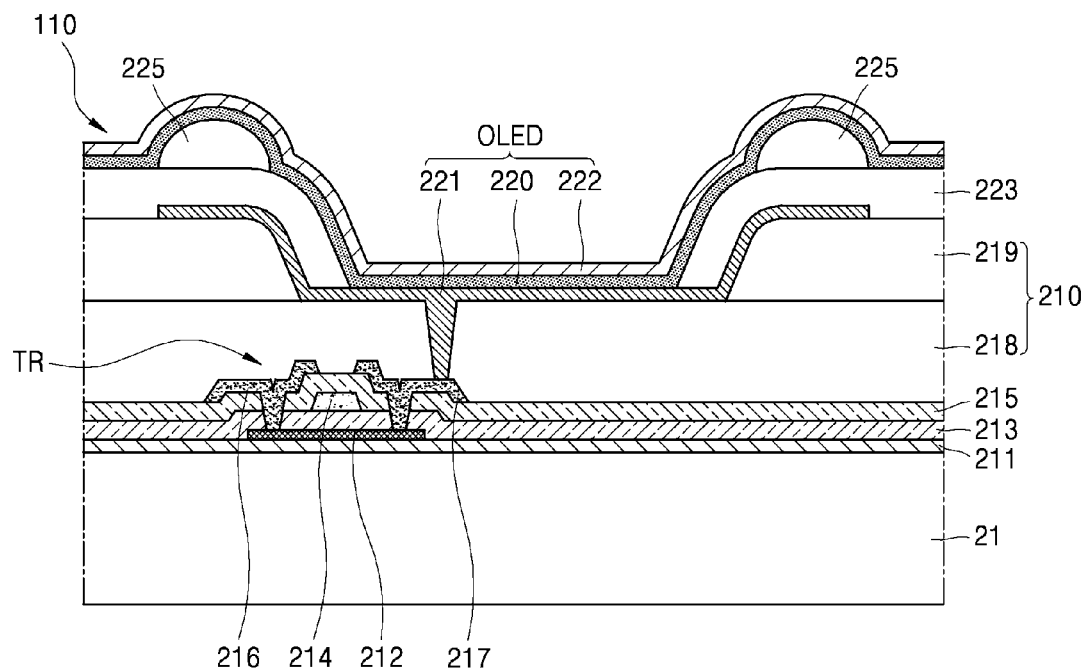
FIG. 5 is an enlarged cross-sectional view of another exemplary embodiment of section "I" illustrated in FIGS. 1 and 2, according to the invention.

FIG. 5 is an enlarged cross-sectional view of another exemplary embodiment of section "I" illustrated in FIGS. 1 and 2, according to the invention. Like reference numerals in FIGS. 3 and 5 denote like elements and thus detailed descriptions thereof are not repeated here for brevity of explanation.

Referring to FIG. 5, unlike the organic light-emitting display apparatus 100 of FIG. 3, an organic light-emitting display apparatus 110 includes the organic emission layer 220 which completely covers the bump 225. The organic emission layer 220 may have a uniform thickness on the first electrode 221, the sidewall of the pixel defining layer 223 and the bump 225.

Where the organic emission layer 220 completely covers the bump 225, the light generated from the emissive region may be transferred along the organic emission layer 220 to the upper surface of the bump 225, and be emitted to the outside due to the curved surface of the bump 225.

Figure 6:
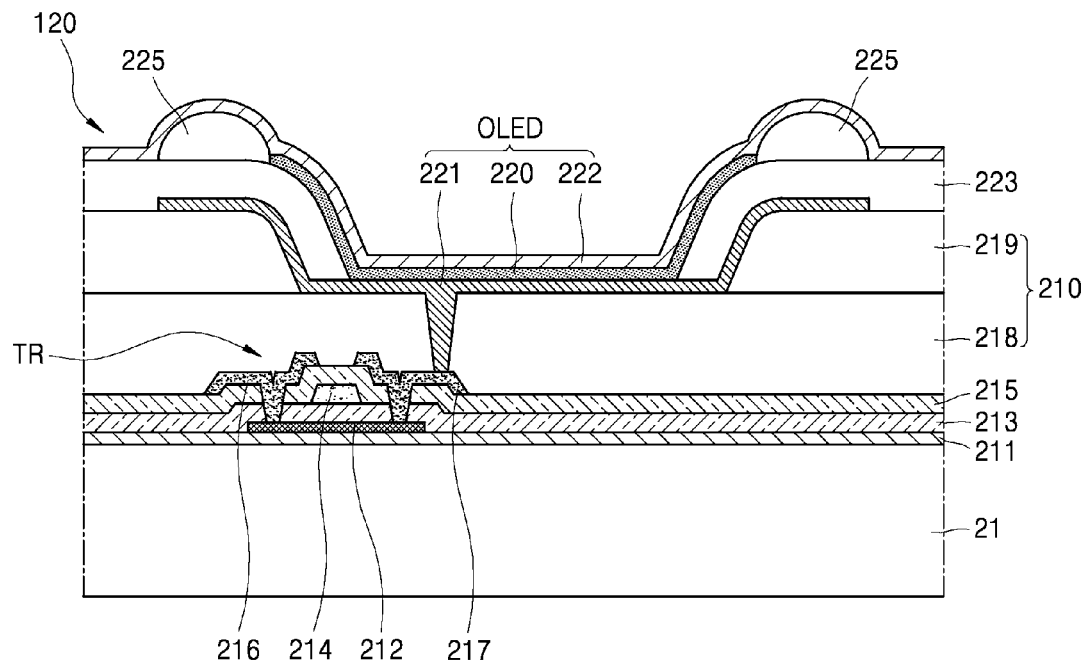
FIG. 6 is an enlarged cross-sectional view of still another exemplary embodiment of section "I" illustrated in FIGS. 1 and 2, according to the invention.

FIG. 6 is an enlarged cross-sectional view of still another exemplary embodiment of section "I" illustrated in FIGS. 1 and 2, according to the invention. Like reference numerals in FIGS. 3 and 6 denote like elements and thus detailed descriptions thereof are not repeated here for brevity of explanation.

Referring to FIG. 6, unlike the organic light-emitting display apparatus 100 of FIG. 3, an organic light-emitting display apparatus 120 includes the organic emission layer 220 that is only disposed up to the boundary of the bump 225 and the pixel defining unit 223. That is, the organic emission layer 220 is disposed on the first electrode 221 disposed on the bottom of the recess, and extended via the sidewall of the pixel defining layer 223 to where the pixel defining layer 223 meets the bump 225. The organic emission layer 220 may have a uniform thickness on the first electrode 221 and the sidewall of the pixel defining layer 223.

Where the organic emission layer 220 is only disposed up to the boundary of the bump 225 and the pixel defining unit 223, the light generated from the emissive region may be transferred along the organic emission layer 220 to where the pixel defining layer 223 meets the bump 225, and reflected by the bump 225 and emitted to the outside.

Figure 7:
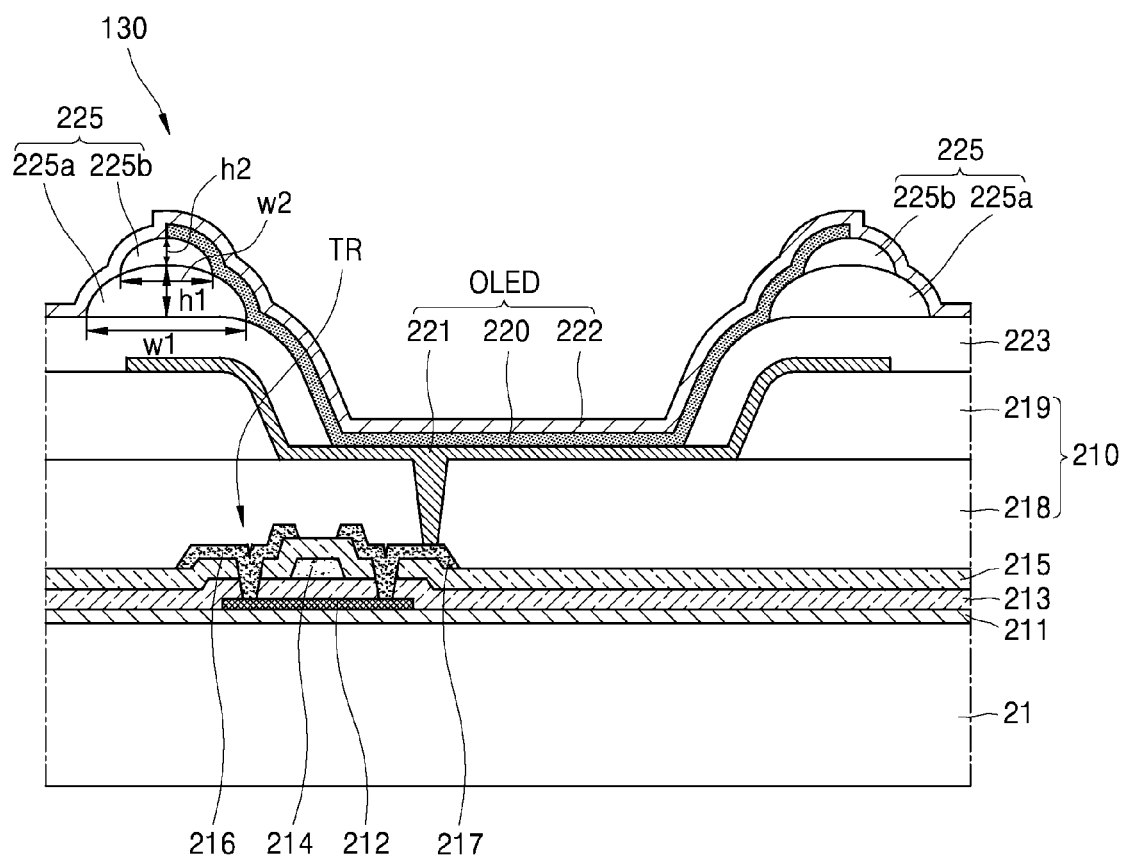
FIG. 7 is an enlarged cross-sectional view of yet another exemplary embodiment of section "I" illustrated in FIGS. 1 and 2, according to the invention.

FIG. 7 is an enlarged cross-sectional view of yet another exemplary embodiment of section "I" illustrated in FIGS. 1 and 2, according to the invention. Like reference numerals in FIGS. 3 and 7 denote like elements and thus detailed descriptions thereof are not repeated here for brevity of explanation.

Referring to FIG. 7, unlike the organic light-emitting display apparatus 100 of FIG. 3, an organic light-emitting display apparatus 130 includes a bump 225 having a multi-layer structure. That is, the bumps 225 may include a first bump layer 225a, and a second bump layer 225b disposed on the first bump layer 225a. The first and second bump layers 225a and 225b may be vertically stacked on the pixel defining layer 223.

The first bump layer 225a has a first width w1, and a first height h1 taken from the pixel defining layer 223. The second bump layer 225b has a second width w2, and a second height h2 taken from the first bump layer 225a. The first width w1 may be greater than the second width w2. The first and second widths w1 and w2 may range from a few μm to tens of μm. The first and second heights h1 and h2 may range from a few μm to hundreds of μm.

The first and second bump layers 225a and 225b may include the same material as the bump 225 of FIG. 3. Also, in an exemplary embodiment of forming an organic light-emitting display apparatus, the first and second bump layers 225a and 225b may be formed by using the method described with reference to FIGS. 4A through 4E. In exemplary embodiments, the first and second bump layers 225a and 225b may be simultaneously formed by using a half-tone mask.

Figure 8:
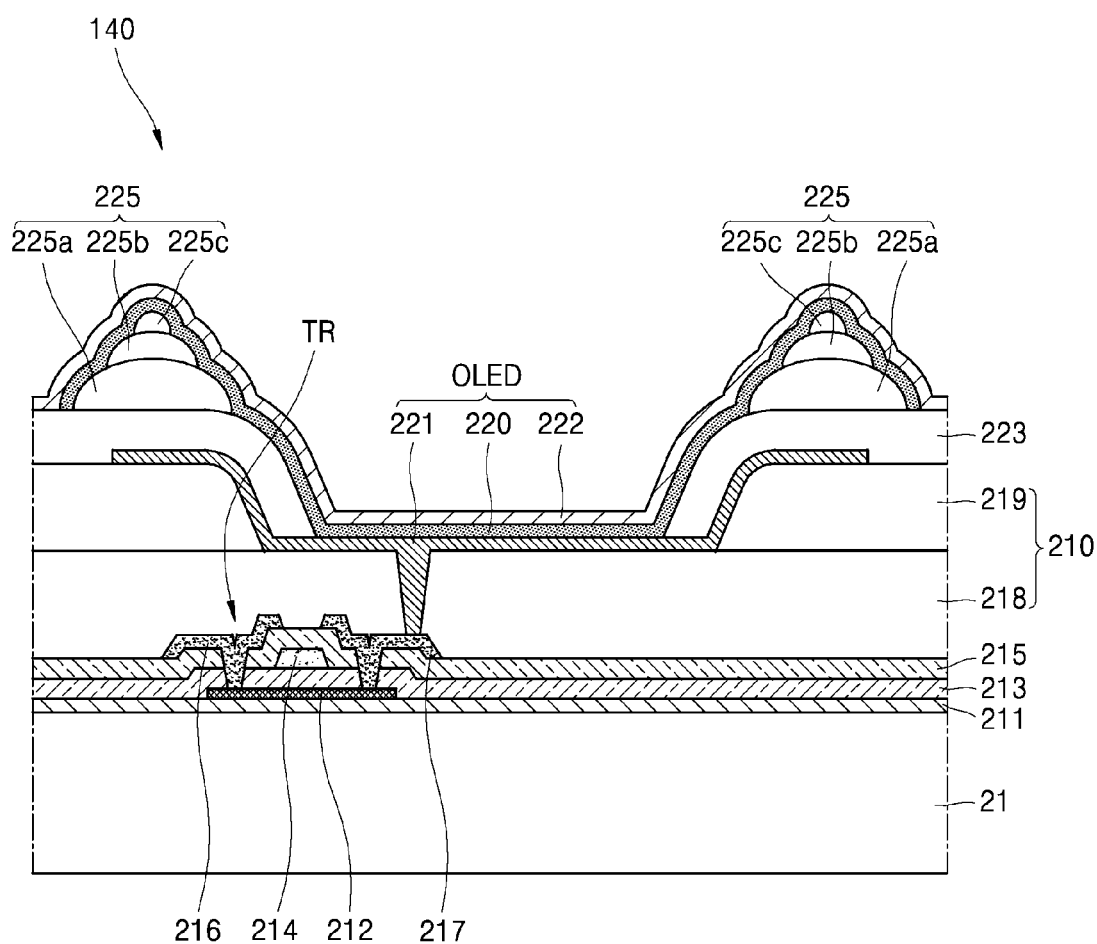
FIG. 8 is an enlarged cross-sectional view of yet another exemplary embodiment of section "I" illustrated in FIGS. 1 and 2, according to the invention.

FIG. 8 is an enlarged cross-sectional view of yet another exemplary embodiment of section "I" illustrated in FIGS. 1 and 2, according to the invention. Like reference numerals in FIGS. 3 and 8 denote like elements and thus detailed descriptions thereof are not repeated here for brevity of explanation.

Referring to FIG. 8, unlike the organic light-emitting display apparatus 100 of FIG. 3, an organic light-emitting display apparatus 140 includes a bump 225 having a multi-layer structure. That is, the bump 225 may include the first bump layer 225a, the second bump layer 225b disposed on the first bump layer 225a, and a third bump layer 225 disposed on the second bump layer 225b. The number of bump layers is not limited thereto, and may be more than three. Thus, a plurality of bump layers may be provided for each bump 225, and the bump layers may be vertically stacked on the pixel defining layer.

The plurality of bump layers may include the same material as the bump 225 of FIG. 3. Also, in an exemplary embodiment of manufacturing an organic light-emitting apparatus, the plurality of bump layers may be formed by using the method described with reference to FIGS. 4A through 4E. In exemplary embodiments, the plurality of bump layers may be simultaneously formed by using a half-tone mask.

If a bump 225 includes a plurality of bump layers, the outer surface of the overall bump 225 includes a plurality of curved portions and thus the light that moves along the organic emission layer 220 may be more easily emitted to the outside by these multiple curved surfaces.

Although exemplary embodiments of the organic light-emitting display apparatuses 100, 110, 120, 130 and 140 according to the invention are described above by referring to cross-sectional views of only one pixel, the organic light-emitting display apparatuses 100, 110, 120, 130 and 140 may include a plurality of pixels, and the inclined structure 209 may be defined in each pixel. That is, a plurality of recesses for defining the inclined structure 209 may be provided, and the OLED may be disposed in each recess.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An organic light-emitting display apparatus comprising:
   an insulating layer in which an inclined structure is defined;
   a first electrode on a bottom surface of the inclined structure and extending onto a sidewall of the inclined structure of the insulating layer;
   a pixel defining layer on the insulating layer and the first electrode, and defining an emissive region and a non-emissive region;
   a bump on the pixel defining layer;
   an organic emission layer on the first electrode; and
   a second electrode on the organic emission layer and extending to the bump on the pixel defining layer.

2. The organic light-emitting display apparatus of claim 1, wherein
   the pixel defining layer extends onto the bottom surface and onto the sidewall of the inclined structure of the insulating layer, and
   an opening is defined in the pixel defining layer and exposes the first electrode in the emissive region.

3. The organic light-emitting display apparatus of claim 1, wherein the bump is adjacent to the emissive region in a plan view.

4. The organic light-emitting display apparatus of claim 1, wherein a width of the bump ranges from about 3 micrometers to about 20 micrometers.

5. The organic light-emitting display apparatus of claim 1, wherein a height of the bump ranges from about 0.3 micrometer to about 5 micrometers.

6. The organic light-emitting display apparatus of claim 1, wherein the sidewall of the inclined structure forms an angle of about 20° to about 70° with respect to a line extended from the bottom surface of the inclined structure.

7. The organic light-emitting display apparatus of claim 1, wherein
   the inclined structure is a recess defined in the insulating layer, and
   the first electrode has a concave shape corresponding to the recess.

8. The organic light-emitting display apparatus of claim 1, wherein
an opening is defined in the pixel defining layer and exposes the first electrode in the emissive region, and
the organic emission layer overlaps a sidewall of the pixel defining layer at the opening.

9. The organic light-emitting display apparatus of claim 1, wherein the organic emission layer overlaps the pixel defining layer and the bump.

10. The organic light-emitting display apparatus of claim 1, wherein the bump comprises:
a first bump layer having a first width; and
a second bump layer on the first bump layer and having a second width,
wherein the first width is greater than the second width.

11. The organic light-emitting display apparatus of claim 1, wherein the first electrode reflects light which is emitted by the organic emission layer.

12. The organic light-emitting display apparatus of claim 1, wherein the bump redirects light which is emitted by the organic emission layer.

13. An organic light-emitting display apparatus comprising:
a substrate;
an insulating layer on the substrate,
a recess defined in the insulating layer and having a sloped sidewall;
an organic light-emitting diode on the insulating layer, and comprising a first electrode extending onto the sloped sidewall of the recess defined in the insulating layer, an organic emission layer, and a second electrode;
a pixel defining layer between the first electrode and the organic emission layer, and defining an emissive region and a non-emissive region; and
a bump on the pixel defining layer.

14. The organic light-emitting apparatus of claim 13, further comprising a plurality of recesses and a plurality of organic light-emitting diodes,
wherein the plurality of organic light-emitting diodes is respectively in the plurality of recesses.

15. The organic light-emitting apparatus of claim 13, wherein the bump comprises a plurality of vertically stacked bump layers.

16. The organic light-emitting apparatus of claim 13, wherein the bump comprises a curved surface.

17. The organic light-emitting apparatus of claim 13, further comprising a thin film transistor connected to the first electrode.

18. The organic light-emitting apparatus of claim 13, further comprising a sealing film which covers the organic light-emitting diode.

* * * * *